United States Patent
Alayil et al.

(10) Patent No.: US 11,324,141 B1
(45) Date of Patent: May 3, 2022

(54) FIN-AND-PIN HEATSINKS AND METHODS

(71) Applicant: Lennox Industries Inc., Richardson, TX (US)

(72) Inventors: Rajesh Alayil, Kerala (IN); Surendran Ramasamy, Tamil Nadu (IN)

(73) Assignee: Lennox Industries Inc., Richardson, TX (US)

( * ) Notice: Subject to any disclaimer, the term of this patent is extended or adjusted under 35 U.S.C. 154(b) by 0 days.

(21) Appl. No.: 17/359,250

(22) Filed: Jun. 25, 2021

(51) Int. Cl.
*G06F 1/16* (2006.01)
*H05K 5/00* (2006.01)
*H05K 7/00* (2006.01)
*H05K 7/20* (2006.01)

(52) U.S. Cl.
CPC .............................. *H05K 7/20418* (2013.01)

(58) Field of Classification Search
CPC ........... H05K 7/20418; H05K 7/20409; H05K 7/2039; H05K 7/20445
See application file for complete search history.

(56) References Cited

U.S. PATENT DOCUMENTS

| | | | | |
|---|---|---|---|---|
| 5,825,621 A * | 10/1998 | Giannatto | ............. | H05K 7/202 361/701 |
| 5,946,193 A * | 8/1999 | Hendrix | ............. | H05K 7/20545 361/704 |
| 6,065,530 A * | 5/2000 | Austin | ................ | H05K 7/2039 165/185 |
| 6,587,339 B1 * | 7/2003 | Daniels | ............. | H05K 7/20445 361/690 |
| 8,538,540 B2 * | 9/2013 | Greenberg | ............ | A61N 1/0543 607/54 |
| 9,936,580 B1 * | 4/2018 | Vinciarelli | ......... | H05K 7/20409 |
| 2003/0184981 A1 * | 10/2003 | Daniels | ............. | H05K 7/20445 361/752 |
| 2008/0218970 A1 * | 9/2008 | Kehret | ............... | H05K 7/20418 361/699 |
| 2015/0327353 A1 * | 11/2015 | Dickover | ............ | H01L 23/4338 361/679.54 |
| 2019/0306985 A1 * | 10/2019 | Ferguson | ............... | H05K 1/181 |

* cited by examiner

*Primary Examiner* — Anthony M Haughton
(74) *Attorney, Agent, or Firm* — Hubbard Johnston, PLLC

(57) ABSTRACT

In one instance, a heat sink for thermal management of an electronic component includes a top plate and a base plate that is displaced from the top plate when in an assembled position. The base plate has a first side and a second side, and the second side is for thermally coupling to the electronic component. The heat sink also includes a plurality of fins each including a flat member formed with a plurality of pin apertures and a plurality of fastener apertures. A plurality of pins is disposed through the plurality of pin apertures. The members of the plurality of fins are spaced from one another. The top plate is coupled to a first end of the plurality of pins, and the base plate is coupled to a second end of the plurality of pins to form a secure structure. Other heat sinks are presented.

20 Claims, 12 Drawing Sheets

FIN-AND-PIN HEATSINKS AND METHODS

TECHNICAL FIELD

This application is directed, in general, to heat sinks for electronics, such as a heat sink for a controller in an HVAC system, and more specifically, to fin-and-pin heatsinks and methods.

BACKGROUND

The following discussion of the background is intended to facilitate an understanding of the present disclosure only. It should be appreciated that the discussion is not an acknowledgement or admission that any of the material referred to was part of the common general knowledge at the priority date of the application.

Many devices and machines include electronics that must dissipate heat. For example, in heating, ventilation, air conditioning and refrigeration (HVACR) applications a control board is included often to control various components, e.g., condenser, compressor, or heating elements. Often the environment can be challenging, and heat management for the electronic components requires ventilation and use of one or more heat sinks. Improvements are desired for managing heat associated with the electronic components.

SUMMARY

According to an illustrative embodiment, a fin-and-pin heat sink for thermal management of an electronic component includes a top plate and a base plate. The top plate has a first side and a second side and includes a rigid flat member formed with a first plurality of bolt apertures and a first plurality of pin recesses on the second side of the top plate. The base plate has a first side and a second side. The base plate includes a rigid flat member formed with a second plurality of bolt apertures and a second plurality of pin recesses on the first side of the base plate. The fin-and-pin heat sink further includes a plurality of fins each including a flat member formed with a plurality of pin apertures and a plurality of fastener apertures. The fin-and-pin heat sink further includes a plurality of pins, each having a first end and a second end, and sized and configured to extend through the plurality of pin apertures with an interference fit. The plurality of pins extends through the plurality of pin apertures in the plurality of fins. The first ends of the plurality of pins extend into the first plurality of pin recesses on the second side of the top plate and the second ends of the plurality of pins extend into the second plurality of recesses on the first side of the base plate. The fin-and-pin heat sink further includes to plurality of fasteners extending at least partially through the top plate and the base plate and urging the top plate towards the bottom plate. The second side of the base plate is configured to thermally couple to the electronic component.

According to an illustrative embodiment, a heat sink for thermal management of an electronic component includes a top plate that is substantially flat and a base plate that is substantially flat and is displaced from the top plate when in an assembled position. The base plate has a first side and a second side, and the second side is for thermally coupling to the electronic component. The heat sink also includes a plurality of fins comprising a flat member formed with a plurality of pin apertures and a plurality of fastener apertures and includes a plurality of pins disposed through the plurality of pin apertures of the plurality of fins and wherein members of the plurality of fins are spaced from one another. The top plate is coupled to a first end of the plurality of pins, and the base plate is coupled to a second end of the plurality of pins to form a secure structure.

According to an illustrative embodiment, a method of manufacturing a fin-and-pin heat sink for thermal management of an electronic component includes providing a top plate and a bottom plate. The top plate has a first side and a second side. The top plate is formed as a rigid flat member. The method further includes forming a first plurality of fastener apertures and a first plurality of pin recesses on the second side of the top plate. The base plate has a first side and a second side. The base plate is formed as a rigid flat member. The method also includes forming a second plurality of fastener apertures and a second plurality of pin recesses on the first side of the base plate; providing a plurality of fins comprising a flat member; and forming a plurality of pin apertures and a plurality of fastener apertures through the flat member of each of the plurality of fins. The method also includes providing a plurality of pins, each having a first end and a second end, and sized and configured to extend through the plurality of pin apertures with an interference fit, extending the plurality of pins through the plurality of pin apertures in the plurality of fins, and placing the first ends of the plurality of pins into the first plurality of pin recesses on the second side of the top plate. The method further includes placing the second ends of the plurality of pins into the second plurality of recesses on the first side of the base plate, disposing a plurality of fasteners at least partially through the top plate and the base plate; and urging the top plate towards the bottom plate using the plurality of fasteners.

According to another illustrative embodiment, a fin-and-pin heat sink for thermal management of an electronic component includes a top plate and a bottom plate. The top plate has a first side and a second side. The top plate includes a rigid flat member formed with a first plurality of bolt apertures. The base plate has a first side and a second side. The base plate includes a rigid flat member formed with a second plurality of bolt apertures. The fin-and-pin heat sink further includes a plurality of fins comprising a flat member formed with a plurality of fastener apertures and includes a plurality of fasteners, each having a first end and a second end, and sized and configured to extend through the plurality of fastener apertures with an interference fit. The plurality of fasteners extends through the plurality of fastener apertures in the plurality of fins. The plurality of fasteners extending at least partially through the top plate and the base plate and hold the top plate and bottom plate in fixed separation. The second side of the base plate is configured to thermally couple to the electronic component.

DESCRIPTION OF THE DRAWINGS

Illustrative embodiments of the present invention are described in detail below with reference to the attached drawing figures, which are incorporated by reference herein and wherein.

DETAILED DESCRIPTION

In the following detailed description of the preferred embodiments, reference is made to the accompanying drawings that form a part hereof, and in which is shown, by way of illustration, specific embodiments in which the invention may be practiced. These embodiments are described in sufficient detail to enable those skilled in the art to practice the invention, and it is understood that other embodiments may be utilized and that logical structural, mechanical, electrical, and chemical changes may be made without departing from the spirit or scope of the invention. To avoid detail not necessary to enable those skilled in the art to practice the invention, the description may omit certain information known to those skilled in the art. The following detailed description is, therefore, not to be taken in a limiting sense, and the scope of the present invention is defined only by the claims. Unless otherwise indicated, as used throughout this document, "or" does not require mutual exclusivity.

Many devices and machines include electronics that must dissipate heat. For example, in heating, ventilation, air conditioning and refrigeration (HVACR) applications a control board is included often to control various components, e.g., condenser, compressor, or heating elements. In some illustrative embodiments, a heat sink is utilized that includes a plurality of fins having pin apertures therethrough and a plurality of pins that go through the fins by way of the pin apertures. The pins terminate at one end in a top plate and at the other end in a base plate. A plurality of fasteners may be used to secure the pins and fins in their assembled position.

Figure 1:
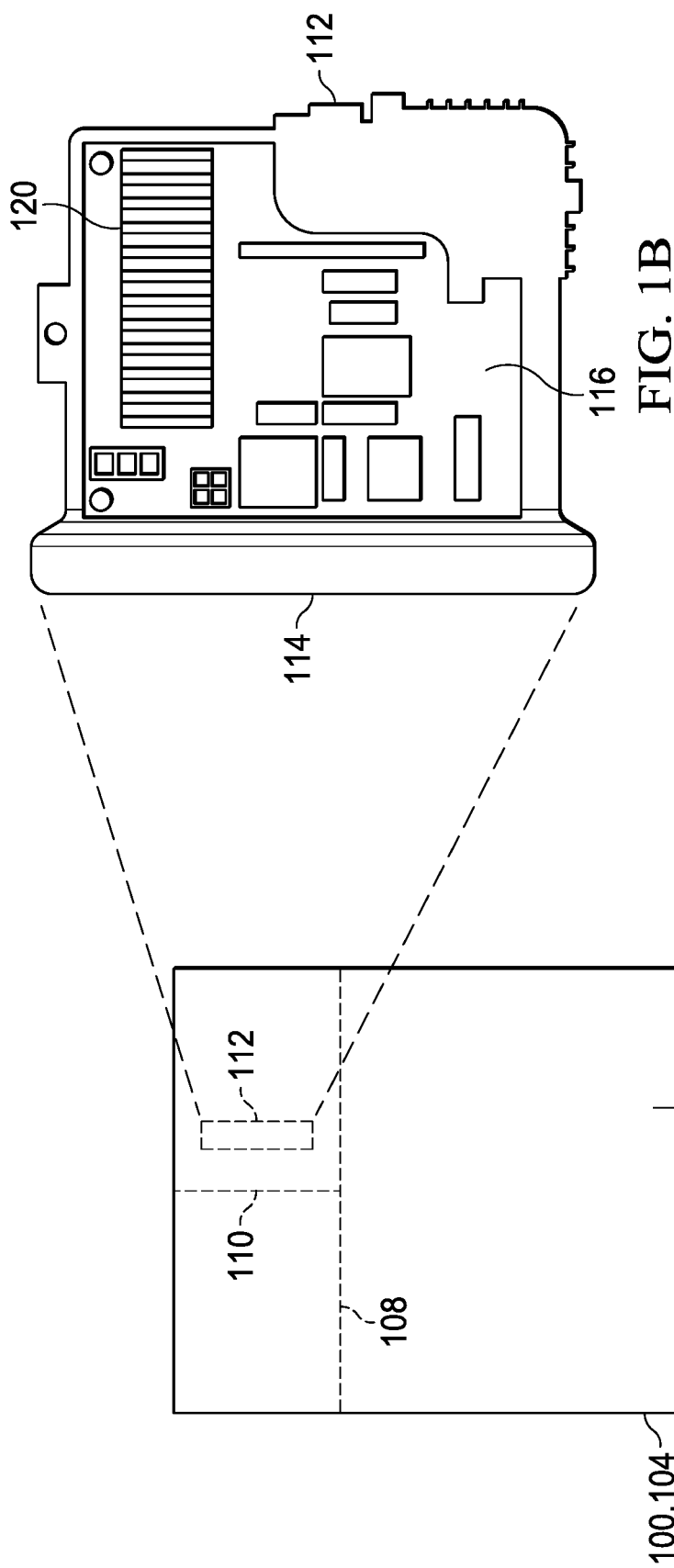
FIG. 1A is a schematic front elevation view of a portion of a heating, ventilation, air conditioning and refrigeration (HVACR) unit, namely, a furnace, having an illustrative embodiment of a fin-and-pin heat sink therein.
FIG. 1B is a schematic diagram of an illustrative embodiment of a controller having an illustrative embodiment of a fin-and-pin heat sink.

Referring to the figures and initially to FIGS. 1A-1B, a portion of a heating, ventilation, air conditioning and refrigeration (HVACR) unit 100, e.g., a furnace 104, is presented as an example of equipment that might include electronic components. In this example, a shelf 108 may hold electronic components such as an electronic controller 112 proximate a partition 110. The controller 112 may have a housing 114 and a control board 116, or circuit board, holding a plurality of electronic components. A fin-and-pin heat sink 120 is coupled to or otherwise associated with the control board 116 or to a particular electronic component on the control board to dissipate heat therefrom. In some embodiments, the fin-and-pin heat sink 120 is coupled to an electronic chip or processor (see, e.g., 140 in FIG. 2) that is to be cooled. While shown in the context of an HVACR unit 100, it be understood that the fin-and-pin heat sink 116 may be used in other contexts to help manage heat for one or more electronic components.

Figure 2:
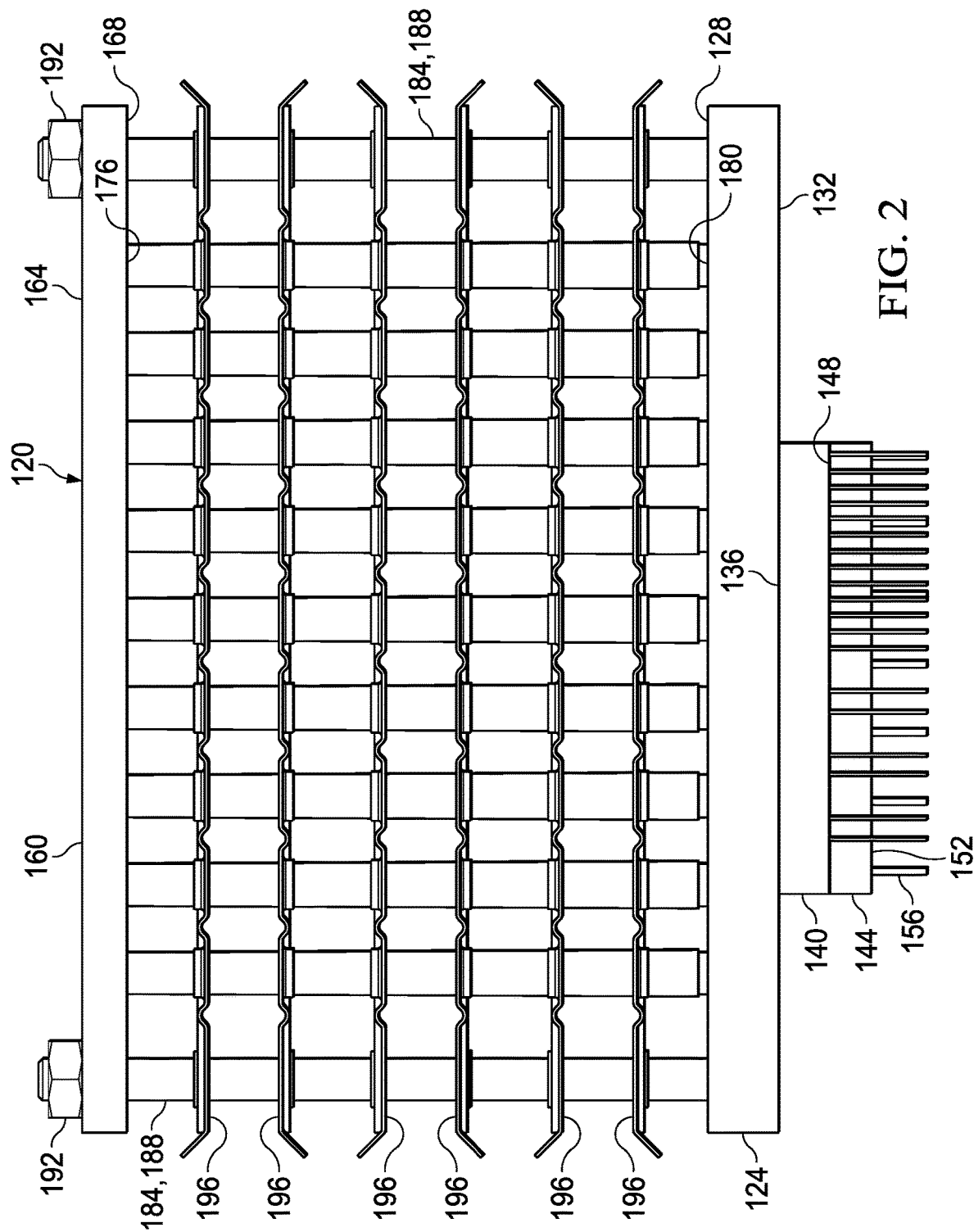
FIG. 2 is a schematic elevation, front view of an illustrative embodiment of a fin-and-pin heat sink.
Figure 3:
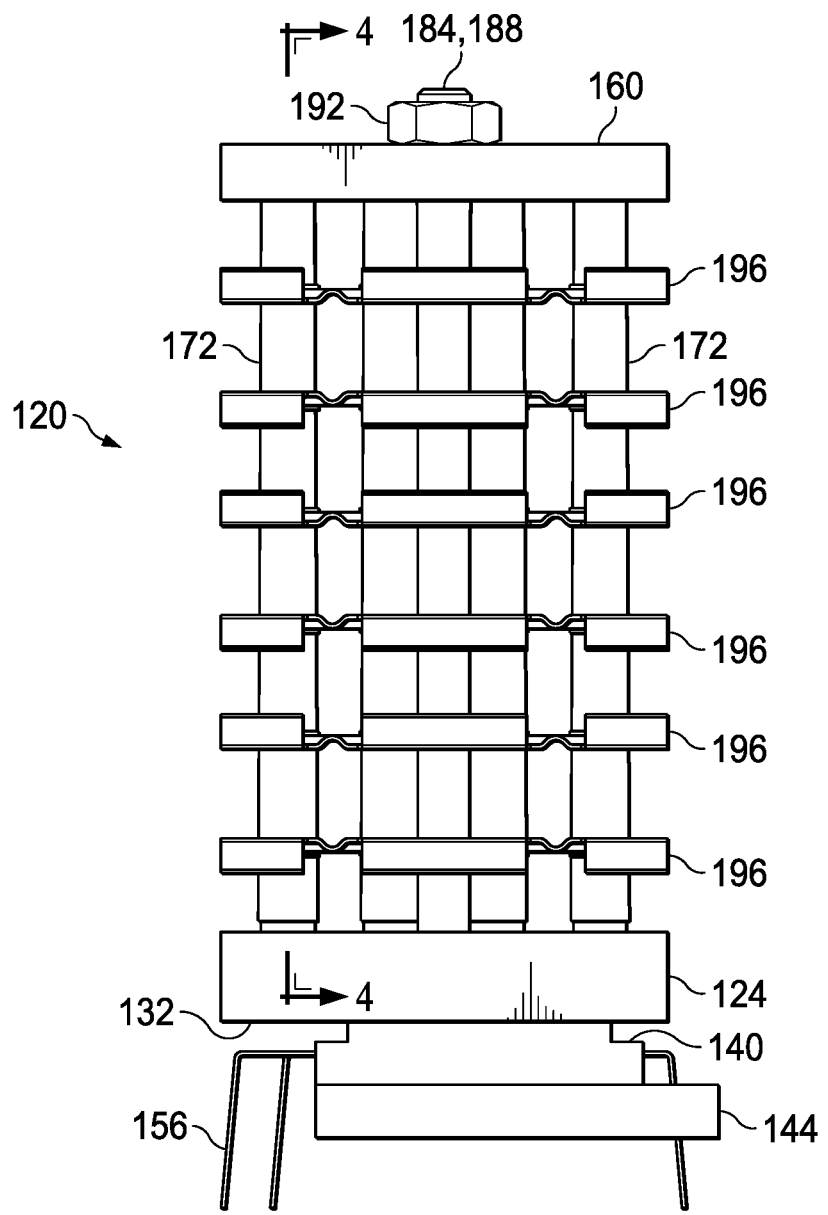
FIG. 3 is a schematic elevation, side view of the illustrative embodiment of a fin-and-pin heat sink of FIG. 2.
Figure 4:
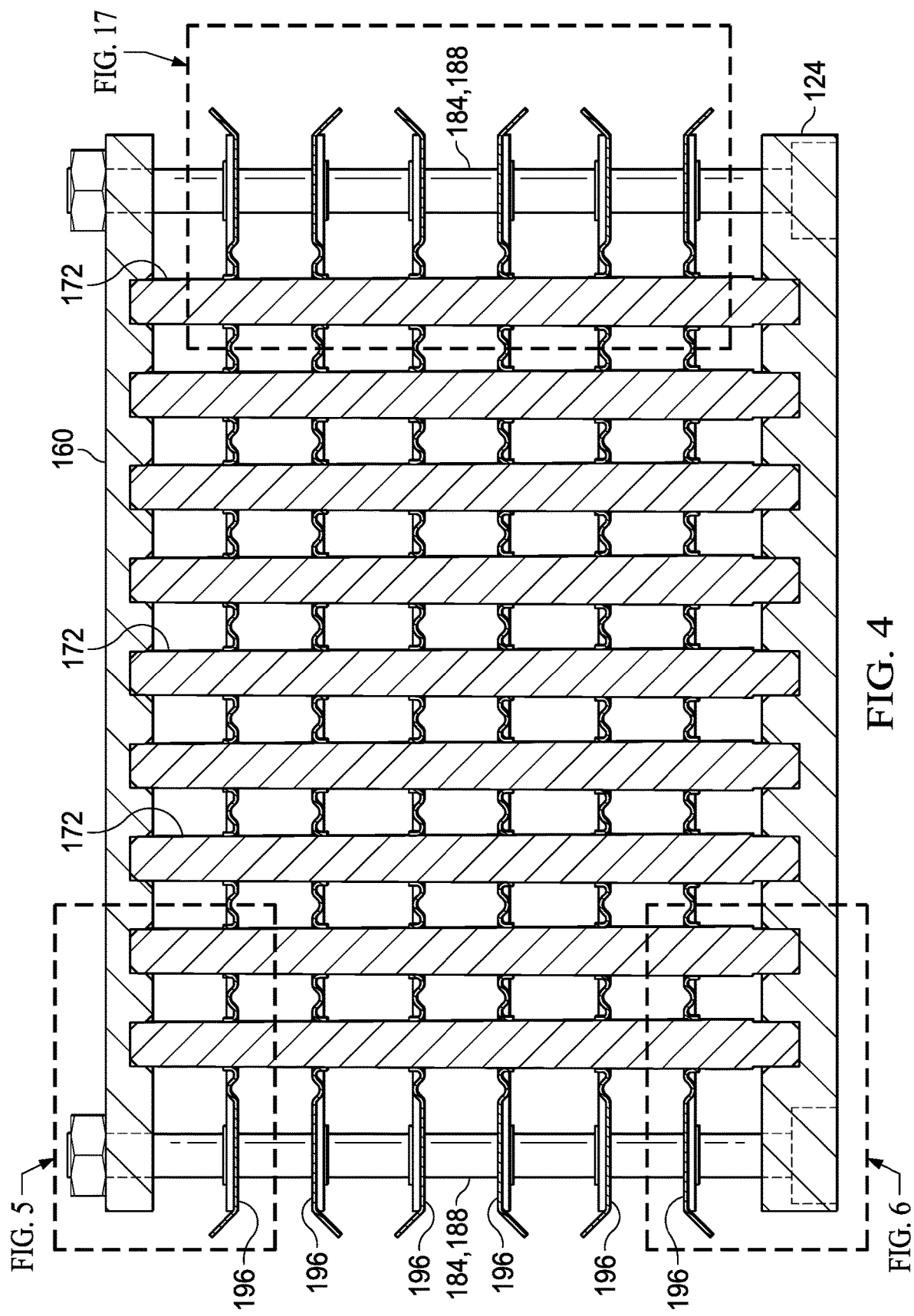
FIG. 4 is another schematic elevation, front view of an illustrative embodiment of a fin-and-pin heat sink.

Referring now primarily to FIGS. 2-7, and initially to FIG. 2, an illustrative embodiment of a fin-and-pin heat sink 120 is presented and is shown in FIG. 2 in elevation. The fin-and-pin heat sink 120 has a base plate 124 that has a first side 128 and a second side 132. The second side 132 is coupled to a first side 136 of an electronic component, such as a processor 140, or electronic chip. A spacer 144, which has a first side 148 and a second side 152, may be coupled to the second side 132 of the baseplate 124. The spacer 144 may be made of a resin. The processor 140 may include semiconductor packaging with a plurality of lead frames 156. The base plate 124 (and top plate 160 discussed below) may be made of any thermal conducting materials, e.g., metal, plastic, or a composite.

Figure 5:
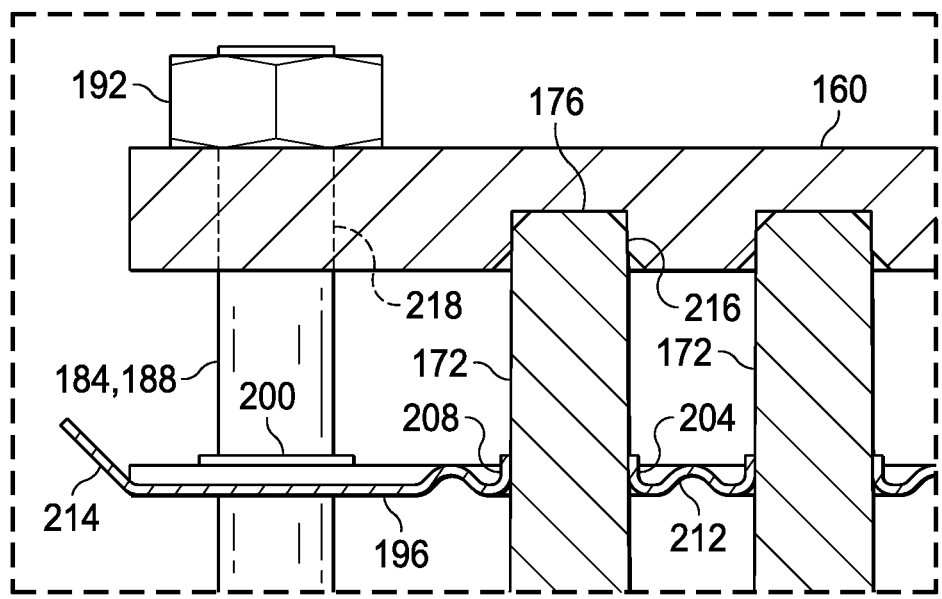
FIG. 5 is a detail of a portion of the fin-and-pin heat sink of FIG. 4.
Figure 6:
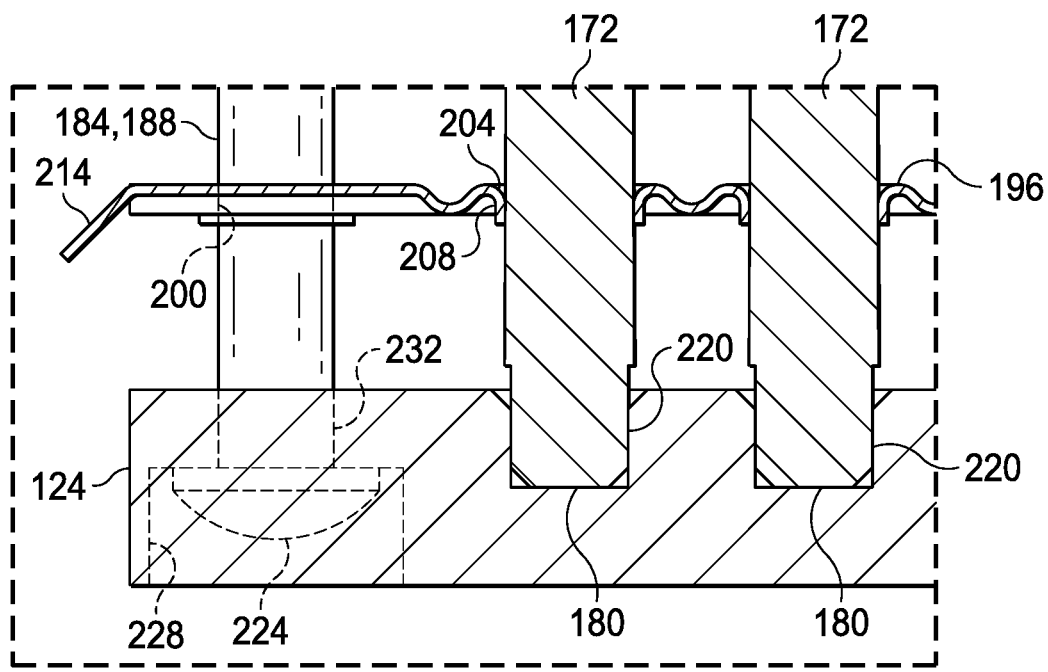
FIG. 6 is a detail of a portion of the fin-and-pin heat sink of FIG. 4.

The fin-and-pin heat sink 120 includes the top plate 160 at an end opposite from the base plate 124. While the term "top" is used here and in the claims, it should be understood that any orientation may be given, and that "top" refers to the orientation shown in FIG. 2 but does not limit orientation. The top plate 160 has a first surface 164 and a second surface 168. A plurality of pins 172 extend between the top plate 160 and the base plate 124. The pins 172 have a first end 176 and a second end 180. In some embodiments, the first ends 176 extend into a portion of the top plate 160 as shown in FIG. 5 and the second ends 180 extend into a portion of the base plate 124 as shown in FIG. 6. A plurality of fasteners 184, e.g., bolts 188 with nuts 192, extend between the top plate 160 and the base plate 124 for securing the fin-and-pin heat sink 120 in an assembled position. The nut 192 could be at the base plate 124 and a bolt head at the top plate 160 in some embodiments or another fastener used.

A plurality of fins 196 are disposed between the top plate 160 and the base plate 124. Referring primarily to FIG. 5, the plurality of fins 196 have a plurality of fastener apertures 200, e.g., bolt apertures, that allow the fastener 184 or bolt 188 to pass therethrough. The plurality of fins 196 also have a plurality of pin apertures 204 through the fins 196 for allowing the pins 172 to pass therethrough. In some embodiments, the pin apertures 204 are sized to create an interference fit with the pins 172 to hold the fins 196 in a spaced position. A portion of the material making up the fins 196 may extend along the pin to form a flange 208 to create better thermal connection between the fin 196 and pin 172. The fins 196 may be formed of sheet metal using sheet metal blanking and laser cuts. The flange 208 can be bent or formed in the operation. Various bends or forms, e.g., bend 212, may be formed in each fin 196 to increase the surface area available to dissipate heat. In addition, bent edge portions 214 may be formed at the edges (a peripheral edge) of the fins 196 to increase the surface area available for heat transfer. In FIG. 5, one may see that the first ends 176 of the pins 172 extend into recesses 216, or cavities, in the top plate 160. In this way when the fasteners 184 pull the top plate 160 and the base plate 124 towards each other, the pins 172 get pushed into the recesses 216 to provide a secure structure—the same principle is applied on the base plate 124 as described further below. The top plate 160 has a plurality of bolt apertures 218.

Referring now primarily to FIG. 6, a detail of a portion of the base plate 114 is presented. In this view, one may see that the second ends 180 of the pins 172 go into a second plurality of recesses 220 formed in the base plate 124. As the fasteners 184 are used to urge the base plate 124 closer to the top plate 160, the second ends 180 of the pins 172 are urged into the recess 220 at the base plate 124 and as previously mentioned the first ends 176 of the pins 172 are urged into the first recesses 216 to form a secure unit. When bolts 184 are used for the fasteners 184, the bolts 188 may have bolt heads 224 that go into bolt-head recesses 228 while the bolts 188 extend through bolt apertures 232.

Figure 7:
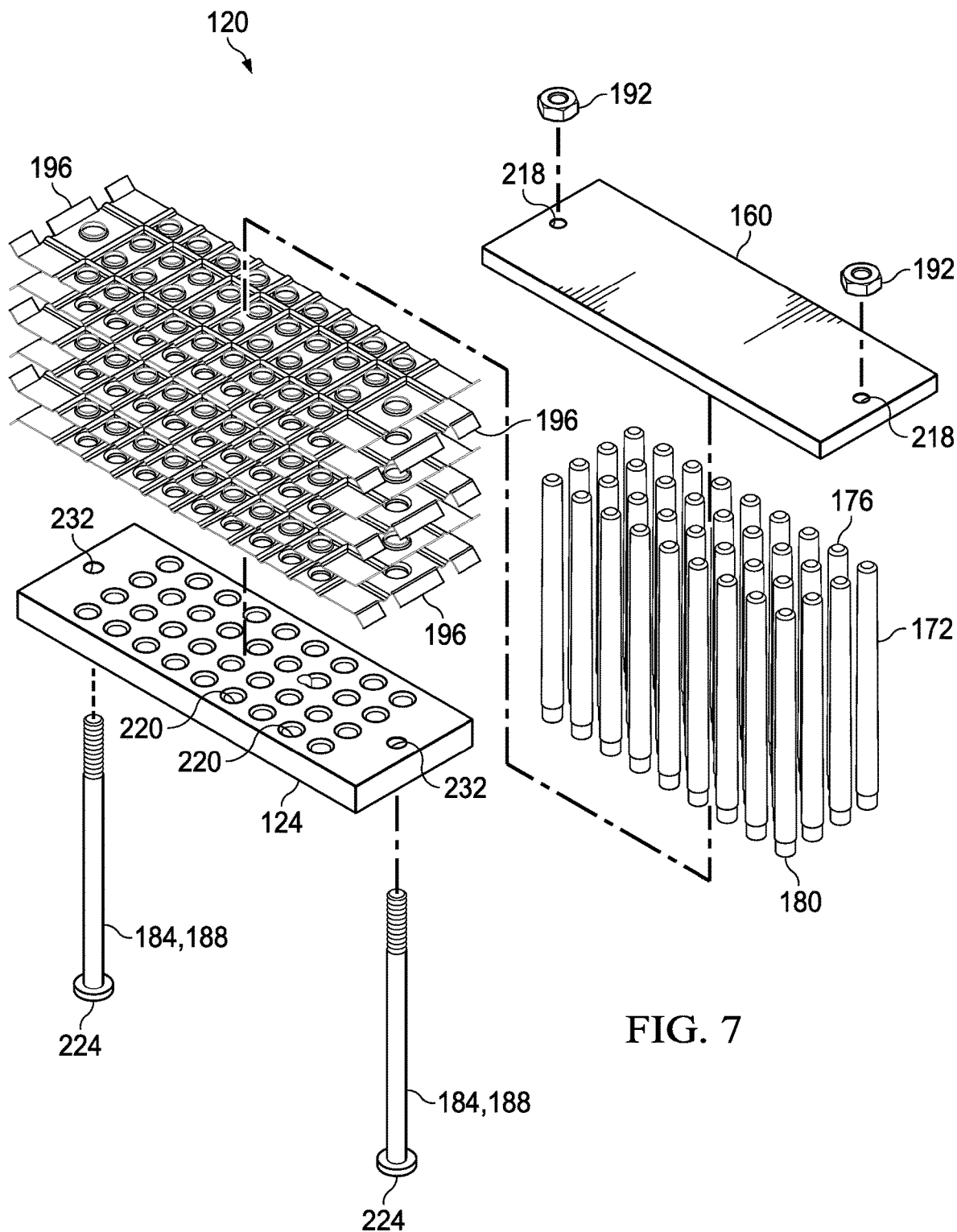
FIG. 7 is a schematic, exploded, perspective view of the illustrative embodiment of a fin-and-pin heat sink of FIG. 4.

Referring now primarily to FIG. 7, an exploded view of the fin-and-pin heat sink 120 is presented. The bolt apertures 218, 232 are clear in this view. One may see that the plurality of pins 172 form a 9×4 rectangular array, but it should be understood that the density of pins may be varied with application and different pin patterns may be used. This view also makes it easy to see that, in this illustrative embodiment, the plurality of fasteners 184 comprises two bolts 188, but other numbers and other fastener types might be used, e.g., screws, anchors, inserts, threaded rods, rivets, retaining rings, studs, buckles, ties, etc.

Figure 8:
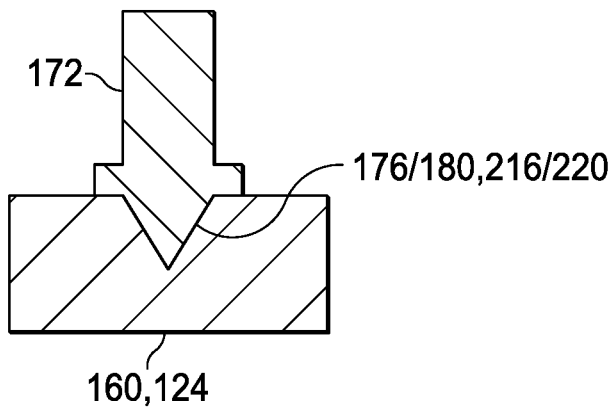
FIG. 8 is a schematic section view of a portion of an illustrative embodiment of a fin-and-pin heat sink showing pins in a recess on the top or bottom plate.

Referring now primarily to FIG. 8, an illustrative example of a mating interface between the first end 176 or second end 180 of the plurality of pins 172 and the matching first plurality of recesses 216 or second plurality of recesses 220 is presented. The first end 176 or second end 180 of the plurality of pins 172 has a V-shape and the first plurality of recesses 216 or second plurality of recesses 220 that mate with the first end 176 or second end 180 of the plurality of pins 172 has a matching V-shape.

Figure 9:
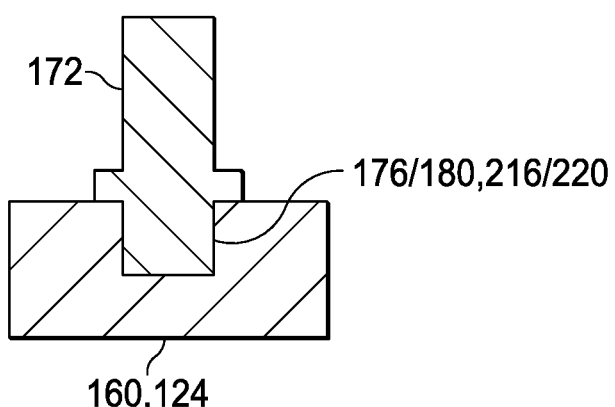
FIG. 9 is a schematic section view of a portion of an illustrative embodiment of a fin-and-pin heat sink showing pins in a recess on the top or bottom plate.

Referring now primarily to FIG. 9, another illustrative example of a mating interface between the first end 176 or second end 180 of the plurality of pins 172 and the matching first plurality of recesses 216 or second plurality of recesses 220 is presented. The first end 176 or second end 180 of the plurality of pins 172 has a block-shape and the first plurality of recesses 216 or second plurality of recesses 220 that mate with the first end 176 or second end 180 of the plurality of pins 172 has a matching block-shape.

The plurality of fins 196 may take any of a number of different shapes provided the shapes include considerable area for heat dissipation and cover the area of the plurality of pins 172. FIGS. 10-15 present a number illustrative examples. In each illustrative embodiment, the fins 196 each typically include a substantially flat member 234 having a first end 236 and a second end 240 separated by a longitudinal distance 244 and a first longitudinal edge 248 and a second longitudinal edge 252. The fin 196 is formed from a conductive material (metal, plastic, composite, etc.) and has the plurality of fastener apertures 232 and the plurality of pin apertures 204. Again, the pin apertures 204 may be sized to form an interference fit with the pins 272 to hold the fins in a spaced arrangement when in an assembled position. The thicknesses of the fins 196 may be varied as desired to heat conduction.

Figure 10:
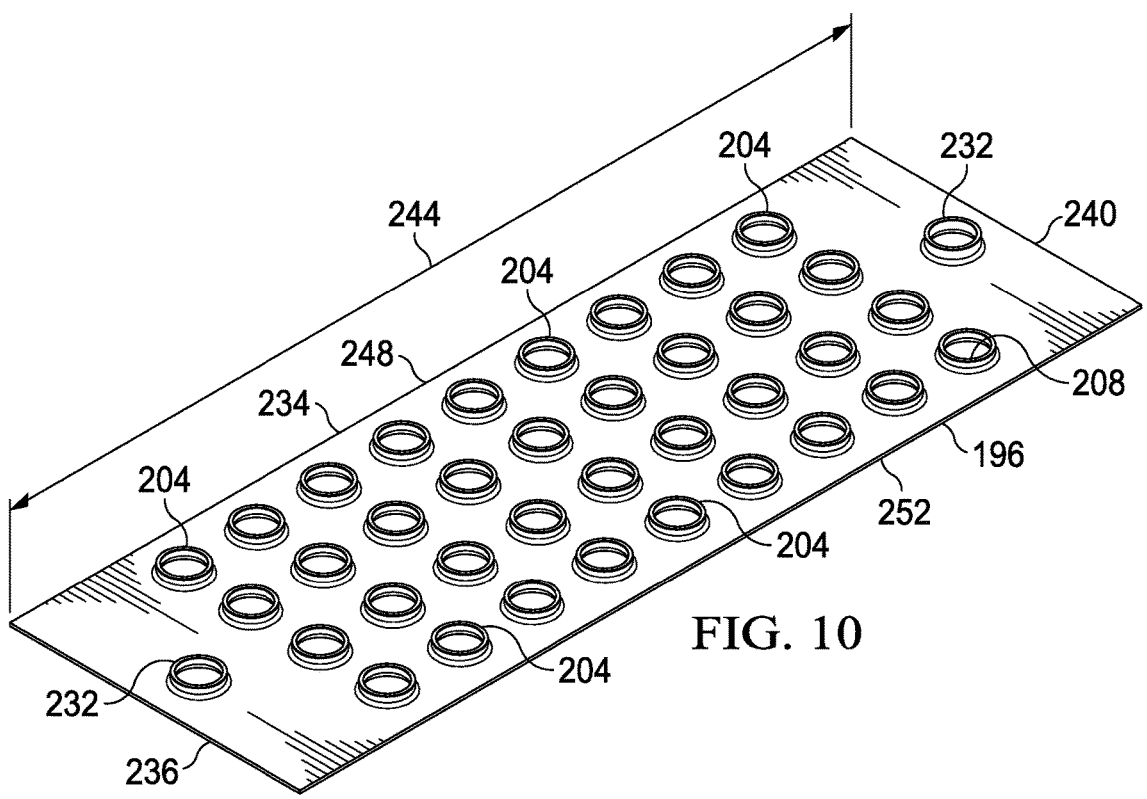
FIG. 10 is a schematic, perspective view of an illustrative embodiment of a fin for use with a fin-and-pin heat sink.

Referring now primarily to FIG. 10, the fin 196 has a 4×9 array of pin apertures 204 and two fastener apertures 232 that are outboard of the pin apertures 204. One can see that a portion of the material forming the fin is bent upward (for orientation shown) to form a flange 208, or sleeve portion. The fan 208 or sleeve portion can help heat flow from the pins 172 to the fins 196.

Figure 11:
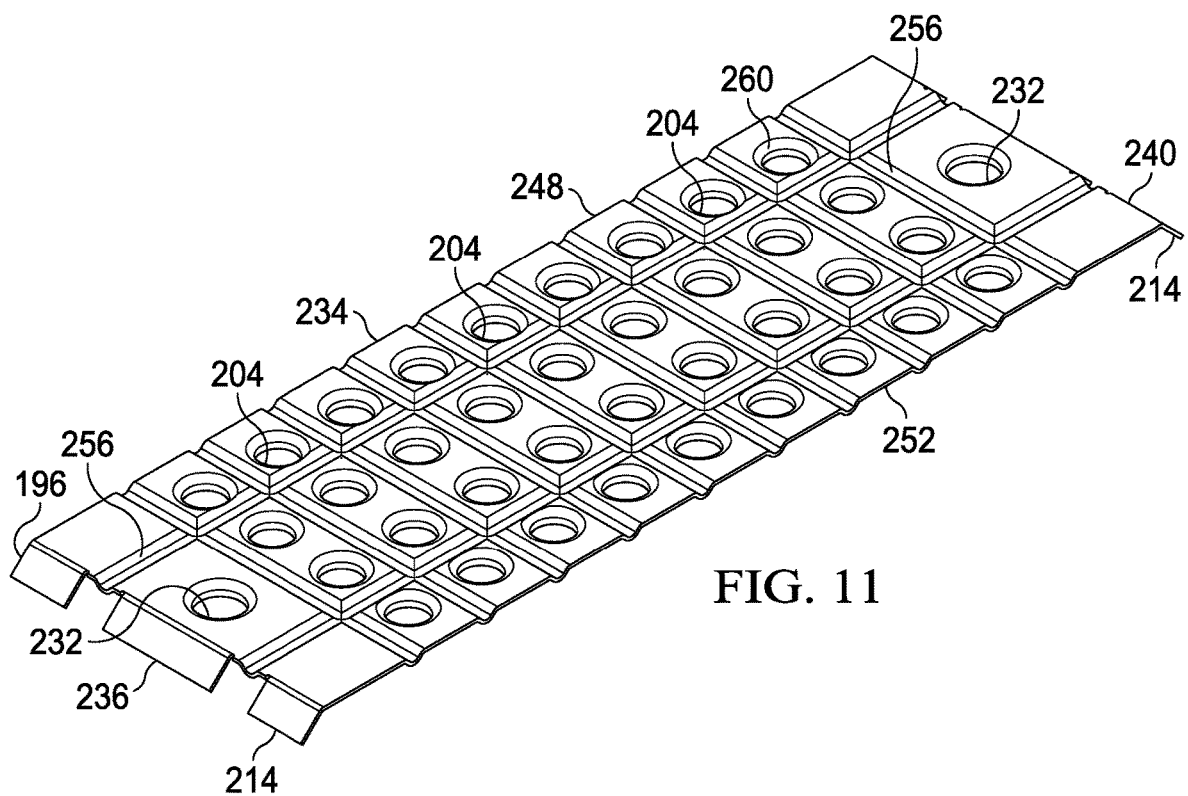
FIG. 11 is a schematic, perspective view of an illustrative embodiment of a fin for use with a fin-and-pin heat sink.

Referring now primarily to FIG. 11, another illustrative embodiment of a fin 196 is presented that is analogous to the fin 196 in FIG. 10, but with a few changes. The fin 196 includes a plurality of bends 256 or valleys forming a grid pattern. The bends 256 may form V-shaped or U-shaped channels that provide additional strength and additional surface area. The fin 196 also includes bent edge portions 214 that also add additional surface area. The material forming the fin 196 is bent downward for the orientation shown and a beveled or rounded entryway 260 is visible.

Figure 12:
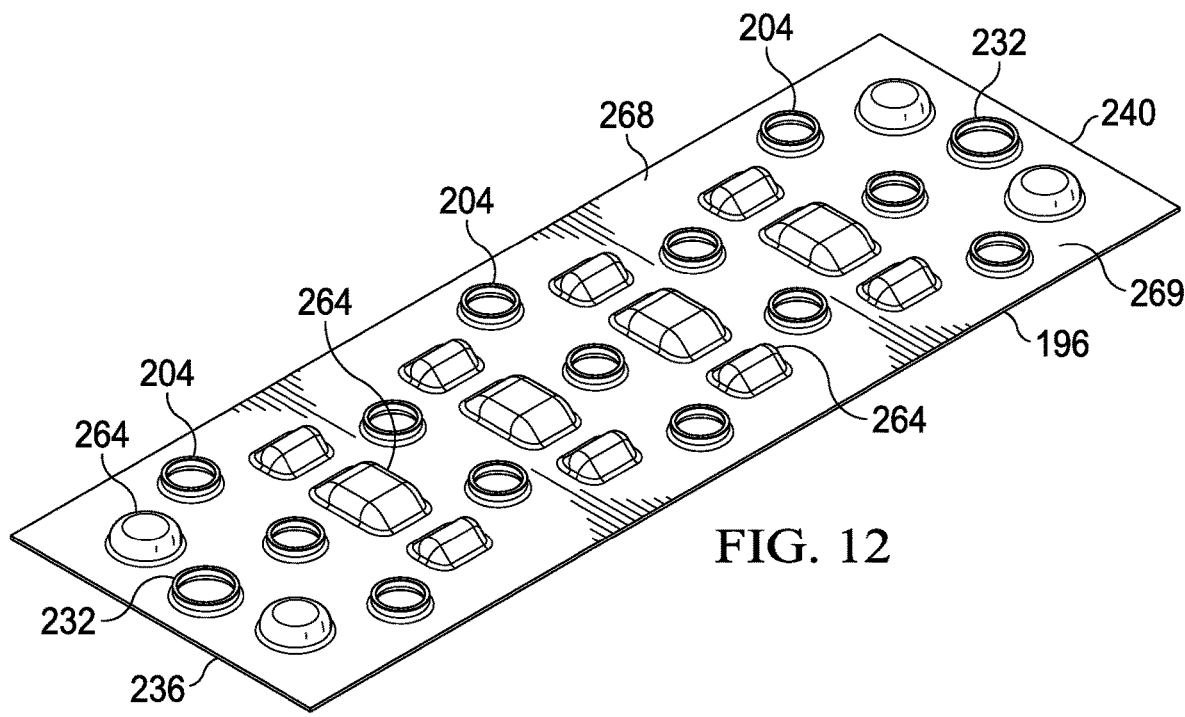
FIG. 12 is a schematic, perspective view of an illustrative embodiment of a fin for use with a fin-and-pin heat sink.

Referring now primarily to FIG. 12, another illustrative embodiment of a fin 196 is presented that is analogous to the fin 196 in FIG. 10, but with a few changes. In this embodiment, the array of pin apertures 204 has a different pattern going 3-2-3-2-3 and has a plurality of protrusions 264 in a number of shapes: angled protrusions, curved protrusions, dome protrusions, or louvered opening. Other shapes may be used for the protrusions. The protrusions 264 may be all the same type or may be a combination as shown. The protrusions 264 add additional surface area for heat dissipation, and may increase the strength of the fin and facilitate better flow turbulence. The plurality of fins 196 can include a plurality of protrusions 264 that extend from a surface 269 of the fins 196.

Figure 13:
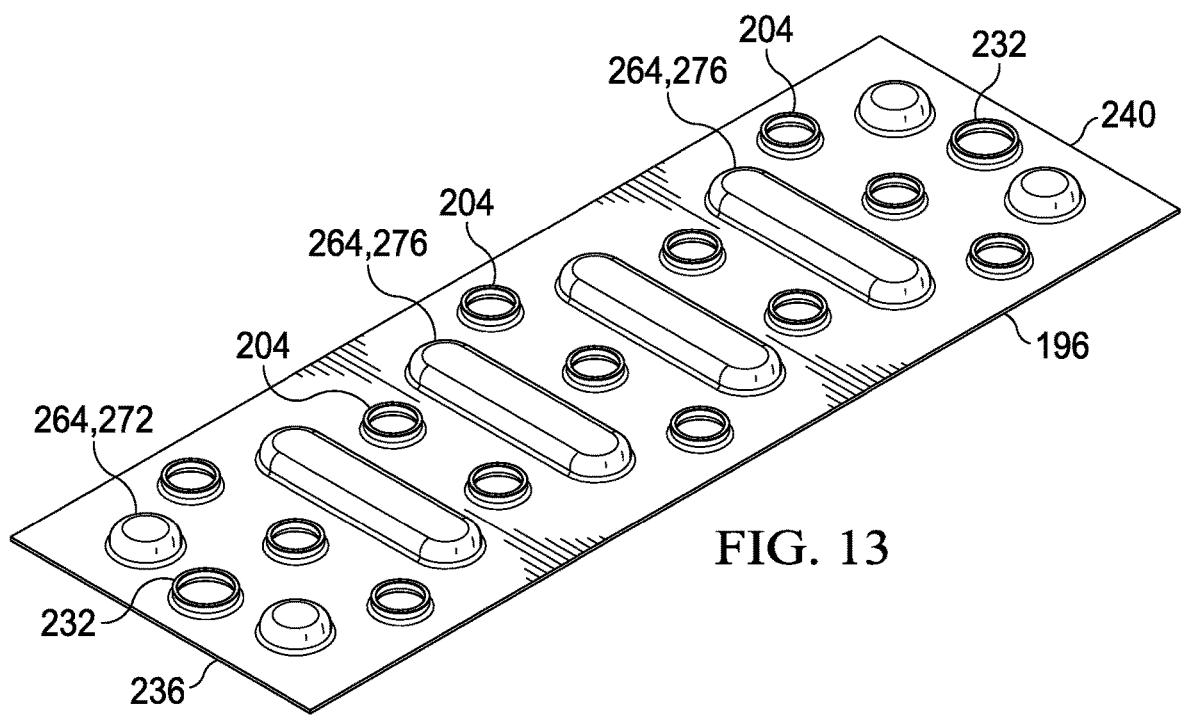
FIG. 13 is a schematic, perspective view of an illustrative embodiment of a fin for use with a fin-and-pin heat sink.

Referring now primarily to FIG. 13, another illustrative embodiment of a fin 196 is presented that is analogous to the fin 196 in FIG. 10, but with a few changes. In this illustrative embodiment, the plurality of pin apertures 204 form a 3-2-3-2-3 pattern again but also includes protrusions 264. The protrusions 264 include dome protrusions 272 and elongated protrusions 276. Other patterns for the plurality of pin apertures 204 may be used. The number of pin apertures 204 may be increased or decreased depending on the need for additional or fewer pins.

Figure 14:
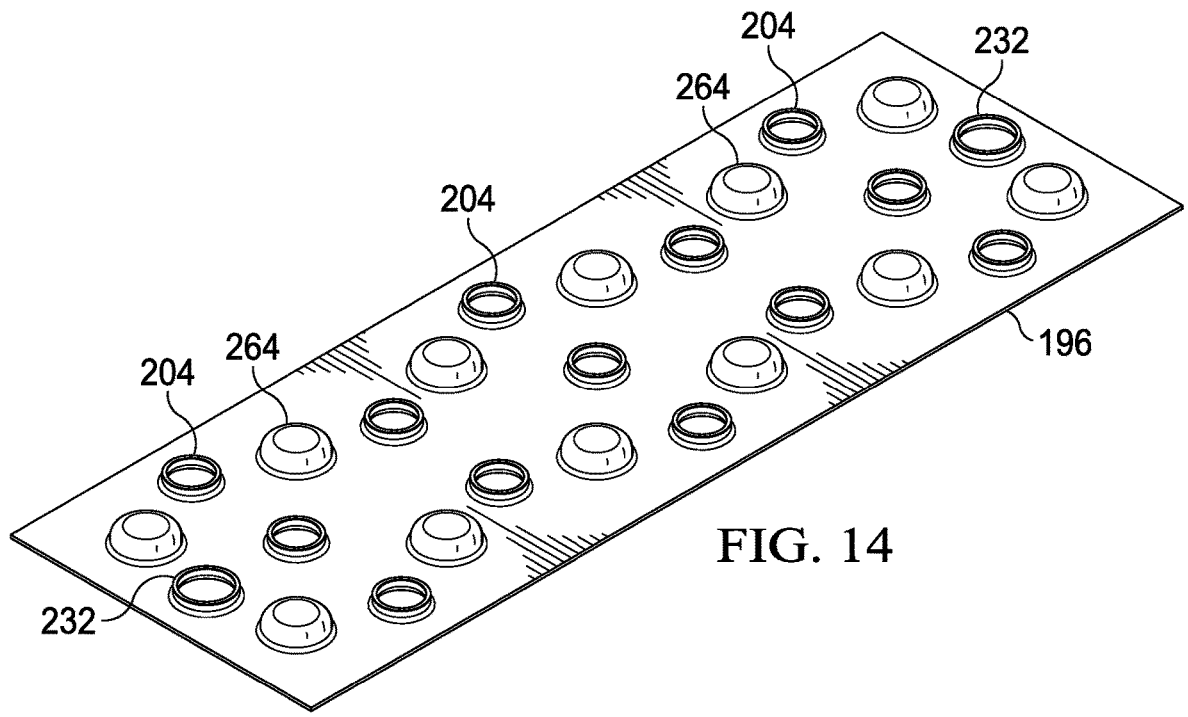
FIG. 14 is a schematic, perspective view of an illustrative embodiment of a fin for use with a fin-and-pin heat sink.

Referring now primarily to FIG. 14, another illustrative embodiment of a fin 196 is presented that is analogous to the fin 196 in FIG. 10, but with a few changes. The fin 196 includes a plurality of protrusions 264 in the form of a plurality of dome protrusions 272.

Figure 15:
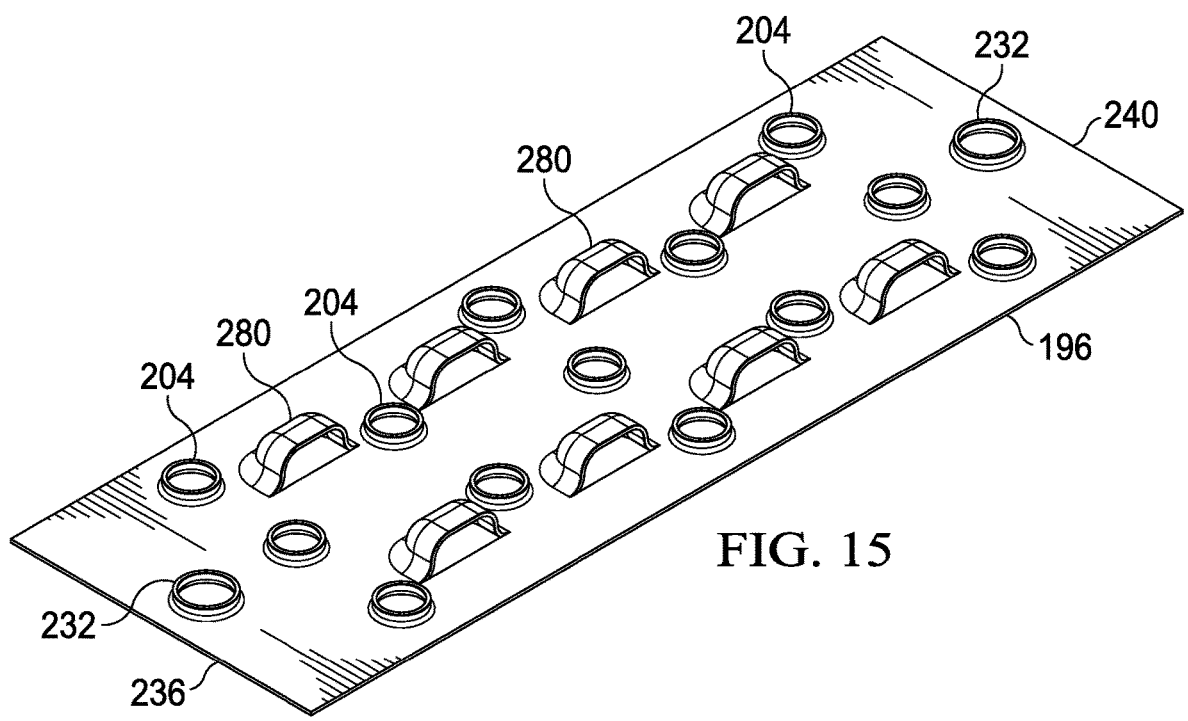
FIG. 15 is a schematic, perspective view of an illustrative embodiment of a fin for use with a fin-and-pin heat sink.

Referring now primarily to FIG. 15, another illustrative embodiment of a fin 196 is presented that is analogous to the fin 196 in FIG. 10, but with a few changes. The fin 196 includes a plurality of protrusions 264 in the form of a plurality of louvered openings 280.

Figure 17:
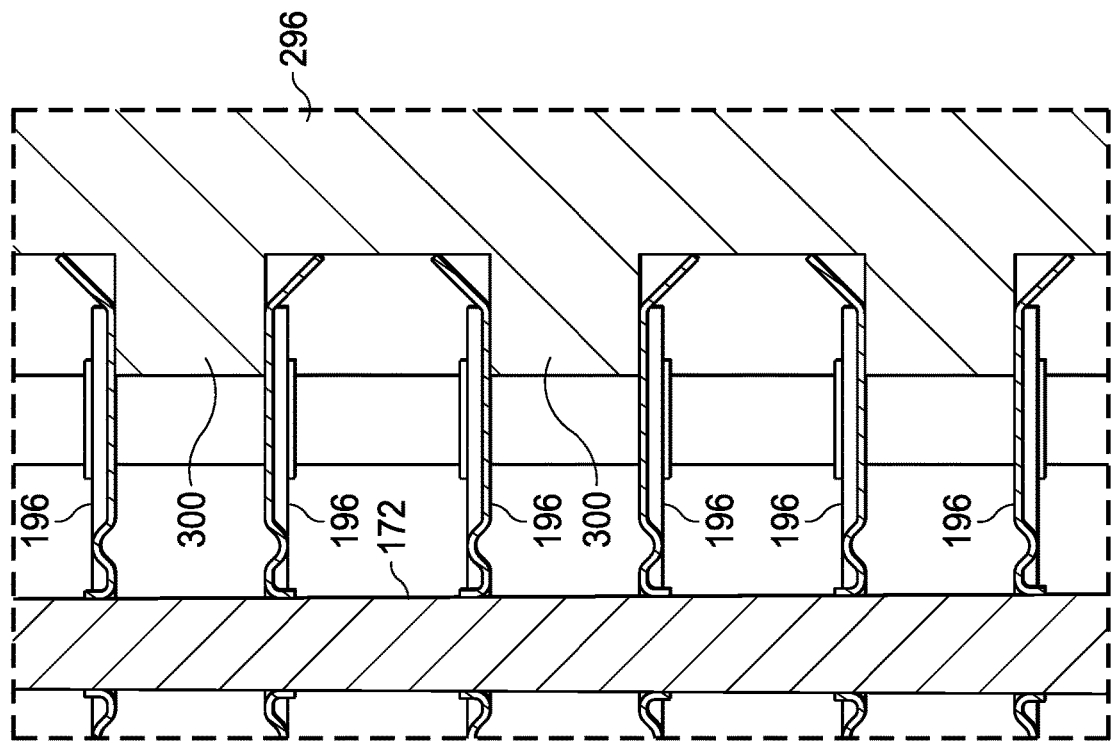
FIG. 17 is schematic elevation view of an illustrative embodiment of a fixture having spaced shelves for receiving fins during assembly of a fin-and-pin heat sink.
Figure 16:
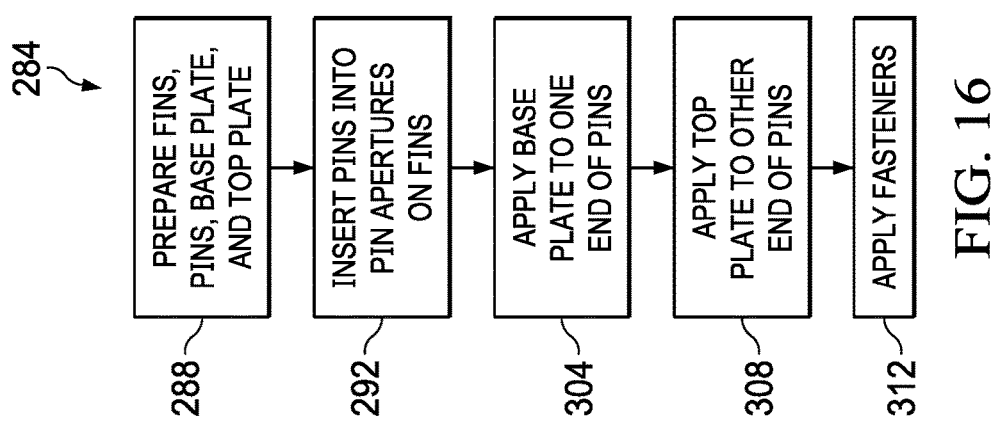
FIG. 16 is a process flow diagram for an illustrative embodiment of a process for manufacturing an illustrative embodiment of a fin-and-pin heat sink.

Referring now primarily to FIG. 16, an illustrative process 284 for manufacturing a fin-and-pin heat sink 120 or thermal management of an electronic component is presented. The fins 196, pins 172, base plate 124, and top plate 160 are prepared at 288. They may be formed from metal, plastic, or a composite. In the case of metal, mechanical drills and punches may be used or lasers. The pins 172 are inserted into the pin apertures 204 of the plurality of fins 196 and spaced at 292. As shown in FIG. 17, a fixture 296 having spaced shelves 300 may be used to receive fins 196 during assembly and to help with proper spacing. The second ends 180 of the plurality of pins 172 may be placed in the plurality of recesses 220 formed in the base plate 124 at 304. Similarly, the first ends 176 of the pins 172 are inserted into the plurality of recesses 216 formed in the top plate 160 at 308. The fasteners 184 are applied at 312 for form the assembled fin-and-pin heat sink 120. In some embodiments, step 312 includes putting bolts 188 through the fastener apertures 200 and applying the matching nuts 192.

Figure 18:
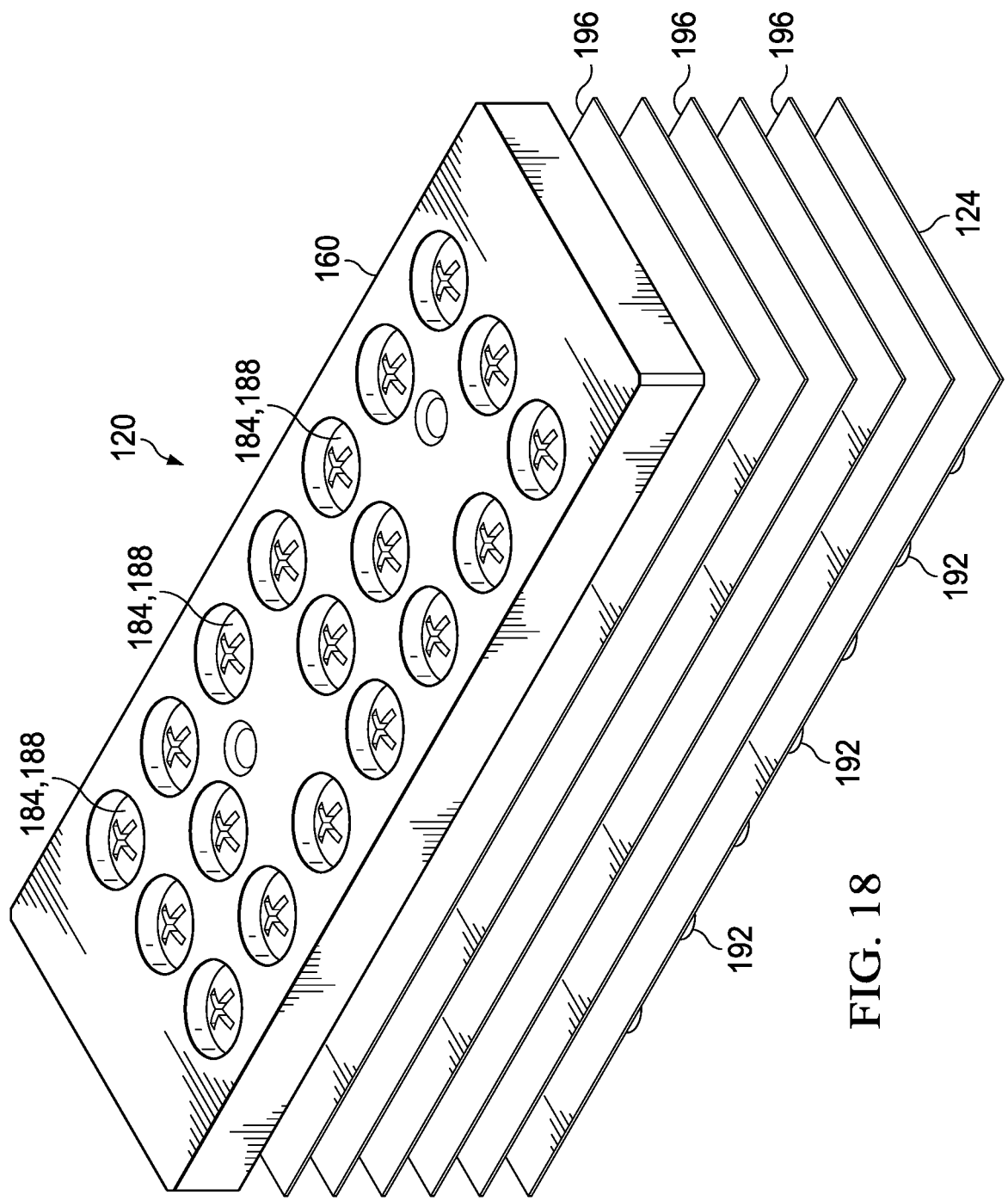
FIG. 18 is a schematic, perspective view of another illustrative embodiment of a fin-and-pin heat sink.

Referring now to FIG. 18, an alternative embodiment of a fin-and-pin heat sink 120 is presented. This embodiment is analogous to those previously presented except the plurality of pins comprises a plurality of fasteners 184, e.g., bolts 188. In other words, bolts 188 may be used to function as the pins 172 did. In another analogous embodiment, the pins 172 may comprises distinct pins like in FIG. 7 and a plurality of bolts like in FIG. 18.

In some embodiments, the pin recesses can be apertures through the base plate or top plate that are then secured.

At least some illustrative embodiments of heat sinks described herein offer a broader area of effective thermal management for both active and passive cooling. At least some of the illustrative heat sinks have a greater density of heat transfer surface is available for a given space. At least some of the illustrative heat sinks allow free air movement through the heat sink, irrespective of orientation.

In some embodiments the pin cross section can be varied to form a taper. In some embodiments the pin pattern can be in line or a staggered arrangement. In some embodiments, the fins can be flat—either perfectly flat or wavy or corrugated.

In illustrative embodiment, the fin-and-pin heat sink for thermal management of an electronic component may be formed as unitary whole by casting, molding, or 3D printing.

Although the present invention and its advantages have been disclosed in the context of certain illustrative, non-limiting embodiments, it should be understood that various changes, substitutions, permutations, and alterations can be made without departing from the scope of the invention as defined by the claims. It will be appreciated that any feature that is described in a connection to any one embodiment may also be applicable to any other embodiment.

What is claimed:

1. A heat sink for thermal management of an electronic component, the heat sink comprising:
   a top plate having a first side and a second side, the top plate comprising a rigid flat member formed with a first plurality of bolt apertures and a first plurality of pin recesses on the second side of the top plate;
   a base plate having a first side and a second side, the base plate comprising a rigid flat member formed with a second plurality of bolt apertures and a second plurality of pin recesses on the first side of the base plate;
   a plurality of fins comprising a flat member formed with a plurality of pin apertures and a plurality of fastener apertures;
   a plurality of pins, each having a first end and a second end, and sized and configured to extend through the plurality of pin apertures with an interference fit;
   wherein the plurality of pins extends through the plurality of pin apertures in the plurality of fins;
   wherein the first ends of the plurality of pins extend into the first plurality of pin recesses on the second side of the top plate and the second ends of the plurality of pins extend into the second plurality of recesses on the first side of the base plate;
   a plurality of fasteners extending at least partially through the top plate and the base plate and urging the top plate towards the bottom plate; and
   wherein the second side of the base plate is configured to thermally couple to the electronic component.

2. The heat sink of claim 1, wherein the plurality of pins comprises a rectangular array of spaced pins.

3. The heat sink of claim 2, wherein the rectangular array of spaced pins comprises a 4×9 array.

4. The heat sink of claim 1, wherein the plurality of fasteners comprises at least two bolts and matching nuts.

5. The heat sink of claim 1, wherein the first end or second end of the plurality of pins has a V-shape and the first plurality of recesses or second plurality of recesses that mate with the first end or second end of the plurality of pins has a matching V-shape.

6. The heat sink of claim 1, wherein the first end or second end of the plurality of pins has a block-shape and the first plurality of recesses or second plurality of recesses that mate with the first end or second end of the plurality of pins has a matching block-shape.

7. The heat sink of claim 1, wherein the plurality of fins comprises a plurality of bends forming a grid pattern on each fin.

8. The heat sink of claim 1, wherein the plurality of fins comprises a plurality of protrusions extending from a surface of the fins.

9. The heat sink of claim 8, wherein the plurality of protrusions includes one or more of the following: angled protrusions, curved protrusions, dome protrusions, and louvered openings.

10. The heat sink of claim 1, wherein the plurality of fins has bent edge portions at a peripheral edge.

11. The heat sink of claim 1,
    wherein the plurality of pins comprises a rectangular array of spaced pins;
    wherein the plurality of fasteners comprises at least two bolts and matching nuts;
    wherein the first end or second end of the plurality of pins has a V-shape and the first plurality of recesses or second plurality of recesses that mate with the first end or second end of the plurality of pins has a matching V-shape;
    wherein the plurality of fins comprises a plurality of bends forming a grid pattern on each fin;
    wherein the plurality of fins comprises a plurality of protrusions extending from a surface of the fins;
    wherein the plurality of protrusions includes one or more of the following: angled protrusions, curved protrusions, dome protrusions, and louvered openings; and
    wherein the plurality of fins has bent edge portions at a peripheral edge.

12. A fin-and-pin heat sink for thermal management of an electronic component, the fin-and-pin heat sink comprising:
    a top plate that is substantially flat;
    a base plate that is substantially flat and is displaced from the top plate when in an assembled position;
    wherein the base plate has a first side and a second side, and the second side is for thermally coupling to the electronic component;
    a plurality of fins comprising a flat member formed with a plurality of pin apertures and a plurality of fastener apertures;
    a plurality of pins disposed through the plurality of pin apertures of the plurality of fins and wherein members of the plurality of fins are spaced from one another; and
    wherein the top plate is coupled to a first end of the plurality of pins; and
    wherein the base plate is coupled to a second end of the plurality of pins to form a secure structure.

13. A method of manufacturing a fin-and-pin heat sink for thermal management of an electronic component, the method comprising:
- Providing a top plate having a first side and a second side, the top plate comprising a rigid flat member;
- forming a first plurality of fastener apertures and a first plurality of pin recesses on the second side of the top plate;
- providing a base plate having a first side and a second side, the base plate comprising a rigid flat member;
- forming a second plurality of fastener apertures and a second plurality of pin recesses on the first side of the base plate;
- providing a plurality of fins comprising a flat member;
- forming a plurality of pin apertures and a plurality of fastener apertures through the flat member of each of the plurality of fins;
- providing a plurality of pins, each having a first end and a second end, and sized and configured to extend through the plurality of pin apertures with an interference fit;
- extending the plurality of pins through the plurality of pin apertures in the plurality of fins;
- placing the first ends of the plurality of pins into the first plurality of pin recesses on the second side of the top plate;
- placing the second ends of the plurality of pins into the second plurality of recesses on the first side of the base plate;
- disposing a plurality of fasteners at least partially through the top plate and the base plate; and
- urging the top plate towards the bottom plate using the plurality of fasteners.

14. The method of claim 12, wherein forming a plurality of pin apertures comprises forming the plurality of pin apertures as a rectangular array.

15. The method of claim 13, wherein the rectangular array comprises a 4×9 array.

16. The method of claim 12, wherein the first end or second end of the plurality of pins has a V-shape and the first plurality of recesses or second plurality of recesses that mate with the first end or second end of the plurality of pins is formed with a matching V-shape.

17. The method of claim 12, wherein the first end or second end of the plurality of pins has a block-shape and the first plurality of recesses or second plurality of recesses that mate with the first end or second end of the plurality of pins has a matching block-shape.

18. The method of claim 12, wherein the plurality of fins comprises a plurality of protrusions extending from a surface of the fins.

19. The method of claim 12, wherein the plurality of fins has bent edge portions at a peripheral edge.

20. A fin-and-pin heat sink for thermal management of an electronic component, the fin-and-pin heat sink comprising:
- a top plate having a first side and a second side, the top plate comprising a rigid flat member formed with a first plurality of bolt apertures;
- a base plate having a first side and a second side, the base plate comprising a rigid flat member formed with a second plurality of bolt apertures;
- a plurality of fins comprising a flat member formed with a plurality of fastener apertures;
- a plurality of fasteners, each having a first end and a second end, and sized and configured to extend through the plurality of fastener apertures with an interference fit;
- wherein the plurality of fasteners extends through the plurality of fastener apertures in the plurality of fins;
- wherein the plurality of fasteners extending at least partially through the top plate and the base plate and hold the top plate and bottom plate in fixed separation; and
- wherein the second side of the base plate is configured to thermally couple to the electronic component.

* * * * *